United States Patent [19]

Ohsawa

[11] Patent Number: 5,644,578
[45] Date of Patent: Jul. 1, 1997

[54] FAILURE MEMORY DEVICE

[75] Inventor: Toshimi Ohsawa, Gyoda, Japan

[73] Assignee: Advantest Corporation, Japan

[21] Appl. No.: 648,244

[22] Filed: May 15, 1996

[30] Foreign Application Priority Data

May 17, 1995 [JP] Japan ................................. 7-118249

[51] Int. Cl.$^6$ .................................................. G06F 11/00
[52] U.S. Cl. ............................................... 371/21.2
[58] Field of Search ................................ 371/21.2, 21.6;
395/182.01, 182.03, 182.05, 182.06; 324/158 R, 158 T

[56] References Cited

U.S. PATENT DOCUMENTS 4,506,322  3/1985  Leigh ........................................ 364/200
5,579,272  11/1996  Uchida .................................... 371/21.2

*Primary Examiner*—Vincent P. Canney
*Attorney, Agent, or Firm*—Staas & Halsey

[57] ABSTRACT

A failure memory device for compressing, in bit, failure data of a multi-bit memory under test to store the compressed failure data in a failure memory is provided, which is capable of generating a mask data. Failure data obtained from the logical comparison results of data written in a four bit memory under test are supplied to AND-OR circuits $27_1$–$27_4$ of a compression circuit 30 through input terminals $21_1$–$21_4$ respectively. In each AND-OR circuit, ANDs between the failure data and four bit compression data set in registers $26_1$–$26_4$ are performed respectively, and the ANDs are ORed. The ORed outputs of the respective AND-OR circuits are supplied to input pins $22_1$–$22_4$ of a failure memory 17. Readout data from output pins $23_1$–$23_4$ of the failure memory are supplied to AND-OR circuits $31_1$–$31_4$ of an expansion circuit 25 respectively. In the AND-OR circuit $31_1$, ANDs between the read out data and the first bit data of the registers $26_1$–$26_4$ are performed respectively and then the ANDs are ORed, and in the remaining AND-OR circuits $31_2$–$31_4$, ANDs between the read out data and the second bit data through the fourth bit data of the registers $26_2$–$26_4$ are performed respectively and the ANDs in each of the AND-OR circuits $31_2$–$31_4$ are ORed. The ORed outputs of the respective AND-OR circuits are supplied to output terminals $24_1$–$24_4$ as mask data.

2 Claims, 4 Drawing Sheets

FAILURE MEMORY DEVICE

BACKGROUND OF THE INVENTION

1. Field of the Invention

The present invention relates to a failure memory device having a failure memory which is used in an apparatus for testing a semiconductor memory to store a failure (defect) data indicating that an output data from a memory under test does not accord with an expected value as a result of a logical comparison between them. More particularly, the present invention relates to a failure memory device which can store failure data in a failure memory in a form of compressed data and can use the data read out from the failure memory as a mask pattern for masking a logical comparison result.

2. Description of the Related Art

FIG. 3 shows a semiconductor memory testing apparatus which uses a prior art failure memory device. A timing signal, which is so-called clock signal, generated by a timing generator 11 is supplied to a pattern generator (PTN GEN) 12. Based on this timing signal, the pattern generator 12 generates address data, write data, control signals, etc. to supply them to a waveform shaping circuit (WAVE SHAPE CCT) 13. The waveform shaping circuit 13 converts the waveform of the inputted signal to a predetermined waveform having a predetermined level and supplies the signal to a memory under test (MUT) 14 at a predetermined timing.

The memory under test 14 has a plurality of cells each of which is specified by a supplied address data as a cell for writing data therein or reading out data therefrom, and data is written in or read out of the specified cell in accordance with a supplied control signal. Normally, after data is written in all the cells of the memory under test based on the address data and the control signal, the data is read out from each cell.

The data read out from the memory under test 14 is logically compared with an expected value data supplied from the pattern generator 12 bit by bit in a logical comparison circuit 15. When this logical comparison circuit 15 detects a mismatch between the readout data from the memory under test 14 and the expected value data from the pattern generator 12, the logical comparison circuit 15 determines that there is an error between them and outputs a defect data, so-called a failure data. A logic "1" is usually outputted as a failure data. On the other hand, when the readout data from the memory under test 14 matches with the expected value data from the pattern generator 12, the logical comparison circuit 15 determines that there is no error between them and outputs a defectless data, so-called a pass data. In this example, since the failure data is represented by logic "1", a logic "0" is outputted as a pass data. Naturally, the pass data (logic "0") is not stored in a failure memory (hereinafter also referred to as a fail memory) 17.

The failure output (logic "1") from the logical comparison circuit 15 is supplied to the failure memory 17 via a mask circuit 16 and stored therein. Usually, when a failure output is generated, a write signal is generated and writing of a failure data in the failure memory 17 is performed by the write signal applied to a write terminal WE of the fail memory 17. The mask circuit 16 has a mask pattern (a mask data for inhibiting a failure output from being written in the fail memory) read out from the failure memory 17 and supplied to the mask circuit 16 so that a failure output from the logical comparison circuit 15 can be selectively masked by the mask pattern on bit by bit basis. The mask pattern will be described later. In case any failure data is not written in the failure memory 17, each bit of a failure output passes through the mask circuit 16 as it is since no mask data exists. Incidentally, at the first test, since no failure data is written in the failure memory 17, the mask pattern does not contain any mask data. Therefore, each bit of a failure output passes through the mask circuit 16 as it is.

In a test of a semiconductor memory, since various tests are performed for a memory under test 14, a number of write and read operations are performed for each address. In general, a testing apparatus is arranged such that when a failure is detected for the first time in the data read out of an address, the failure data is written in the fail memory and thereafter, even if a failure is detected in the data read out of the same address in a succeeding read operation, the write operation of the failure data to that address is inhibited by the mask circuit 16 for masking the failure data so that the failure data can not be written in that address again. That is, the mask data (mask pattern) read out of the failure memory 17 serves to disable corresponding one or more AND gates of the mask circuit 16.

The failure memory 17 has the same capacity, i.e., the same address space and the same bit width, as that of the memory under test 14, and logic "1" representing a failure data is written in the address portion of the failure memory 17 which has the same address as that of the cell of the memory under test 14 which has been determined to be failure (defect). The failure information written in the failure memory 17 is used for the failure analysis, that is, the creation of a failure bit map for indicating which position in the memory under test 14 the failure exists, the repair process, i.e., the process for performing a relief of the failure bit using a relief redundant line provided in the memory under test 14, and the like. In such a way, when the failure data is written in the same address of the failure memory 17 as that of each cell of the memory under test 14 in correspondence to the address of each cell, it is necessary that as the capacity of the memory under test 14 increases, the capacity of the failure memory 17 must also be increased so as to have the same capacity as that of the memory under test 14, i.e., must have the increased memory capacity.

Incidentally, in the prior art semiconductor memory testing apparatus shown in FIG. 3, the memory under test 14 is a multi-bit memory in which a four bit data can be written at a time and a four bit data stored can be read out at a time. In case the memory under test 14 is a multi-bit memory of four bits, four exclusive-OR circuits corresponding to the respective output bits of the memory are provided in the logical comparison circuit 15, and four AND gates corresponding to the respective four exclusive-OR circuits are provided in the mask circuit 16. The outputs of the four AND gates are directly connected to the failure memory 17 except that one of the outputs is connected to the failure memory 17 via a multiplexer 19. The failure outputs from the AND gates are specified in address by a failure write address signal (address data for specifying an address of a cell in the failure memory 17 where a failure output is to be stored) from the pattern generator 12 and are written in the predetermined cells.

On the other hand, regarding the result of the comparison on these four bits, if there is a failure on any one or more of the four bits, the comparison result may be written in the failure memory 17 as the failure data of bits less than four bits, for example, of two bits or one bit. That is, the comparison result may be written in a form of bit compression or reduction. In the example shown in the figure, when the bit compression is performed, the outputs of the four AND gates of the mask circuit 16 are logically ORed by an OR circuit 18 and the ORed output is selected by the multiplexer 19 and is inputted to the failure memory 17 instead of the output of one AND gate of the mask circuit 16. In this case, a variable bit width memory is used as the failure memory 17, and a data indicating the degree of compression is inputted to an input terminal 20 of the failure memory 17. In this example, the four bit data is compressed to a one bit data. By this process, the written failure data has one bit width and the depth of four time.

In the aforementioned multi-bit memory for writing and reading a plurality of bits in and out of one address at a time, a relief redundant line for relieving a failure bit detected is often provided for every plurality of bits. For example, in a multi-bit memory of 16 bits, a common redundant relief line is often provided for each of upper 8 bits and lower 8 bits or for each of 8 even bits and 8 odd bits. In such a case, when the failure memory 17 is used for the repair process, respective logical comparison results for a plurality of data bits read out from the multi-bit memory under test 14 are logically ORed by the OR circuit 18 and then the ORed output is taken in the failure memory 17 as mentioned above. In other word, failure data are compressed and then the compressed data is taken in the failure memory 17. By such a process, the capacity of the failure memory 17 is not necessary to be equal to the capacity of the memory under test 14 and thus, the capacity of the failure memory 17 can be reduced less than that of the memory under test 14.

As mentioned above, a semiconductor memory is generally subjected to various tests by changing parameters, and the portion where a failure data is already stored once is masked by a mask data so that a failure data detected in a succeeding test is not stored therein again. To this end, two areas (blocks), one for storing the failure data and the other for generating the mask data, are provided in the failure memory. A storing process of the failure data and a process of generating the mask data in this case will be explained with reference to the flow chart of FIG. 4.

First, the first test is performed in step S1. If the test result is "pass", i.e., defectless, then the process proceeds to the next test in step S4. If the test result is "failure", i.e., defect, then a failure data is taken in block 1 of the failure memory. Next, a repair analysis is performed on the failure data taken in the block 1 in step S2, and if the failure produced can be relieved, then the process proceeds to step S3 and if the failure produced cannot be relieved, then the process ends. In step S3, a copy of the failure data taken in the block 1 is formed and stored in block 2 for pattern generation, and thereafter the block 1 is cleared. In the second test and the succeeding tests in step 4, the failure data of the test result (i.e., the logical comparison result) is taken in the block 1 of the failure memory while a mask pattern is being generated from the block 2. This mask pattern serves not to always write in the failure memory the logical comparison result on a cell of the memory under test where a failure data has occurred in the previous test. Similarly to the first test, when this test result is "pass", the process proceeds to the next test in step S4, and when this test result is "failure", the process proceeds to step S5. In step S5, corresponding bits in the data stored in the block 1 and the data stored in the block 2 are logically ORed and this ORed data is written in the block 1. In step S6, a repair analysis is performed on the ORed data and a check is effected to determine whether the "failure" produced in the previous tests can be relieved. If the "failure" can be relieved, the process proceeds to step S7 wherein a copy of the failure data written in the block 1 is taken and is stored in the block 2 for the mask pattern, and thereafter the failure data in the block 1 is cleared. On the other hand, if the "failure" cannot be relieved, the process ends. The above process is repeated for the number of times equal to the number of test items.

In the prior art failure memory device of the aforementioned arrangement, when the failure data is written in each cell of the failure memory in correspondence to each cell (bit) of the memory under test, the mask pattern can be generated. However, when a plurality of logical comparison results are logically ORed and the ORed data in the form of data compression is written in the failure memory, the corresponding mask pattern cannot be generated.

SUMMARY OF THE INVENTION

According to the present invention, a plurality of registers for setting the compression data are provided. The desired compression data is set in each of these registers respectively. A plurality of data among the failure data from n input terminals (n is an integer equal to or greater than 2) are compressed in bit by a compression circuit in accordance with the compression data set in one of these registers and are supplied to the failure memory. In addition, the data read out of the failure memory is expanded in bit by an expansion circuit in accordance with the compression data stored in the one register and the expanded data are outputted to n output terminals.

The registers for storing the compression data are arranged such that n registers each comprising n bits corresponding to the n input terminals are provided. The compression circuit is arranged such that n AND-OR circuits each comprising n AND circuits and an OR circuit for performing an operation of logical sum (OR) of the outputs of the AND circuits are provided. The i-th AND-OR circuit ($i=1, 2, \ldots, n$) performs operations of n logical products (ANDs) between the outputs of the first through the n-th bits of the i-th register and the input data from the first through the n-th input terminals, respectively, and then performs an operation of logical sum of these AND outputs thereby to supply the ORed output to the i-th input pin of the failure memory. Further, the expansion circuit is arranged such that n AND-OR circuits each comprising n AND circuits and an OR circuit for performing an operation of logical sum of the outputs of the AND circuits are provided. The j-th AND-OR circuit performs n AND operations between the outputs of the first through the n-th pins of the failure memory and the outputs of the j-th bits ($j=1, 2, \ldots, n$) of the first through the n-th registers, respectively, and then performs an OR operation of these AND outputs thereby to supply the ORed output to the j-th output terminal.

DESCRIPTION OF THE PREFERRED EMBODIMENT

Figure 1:
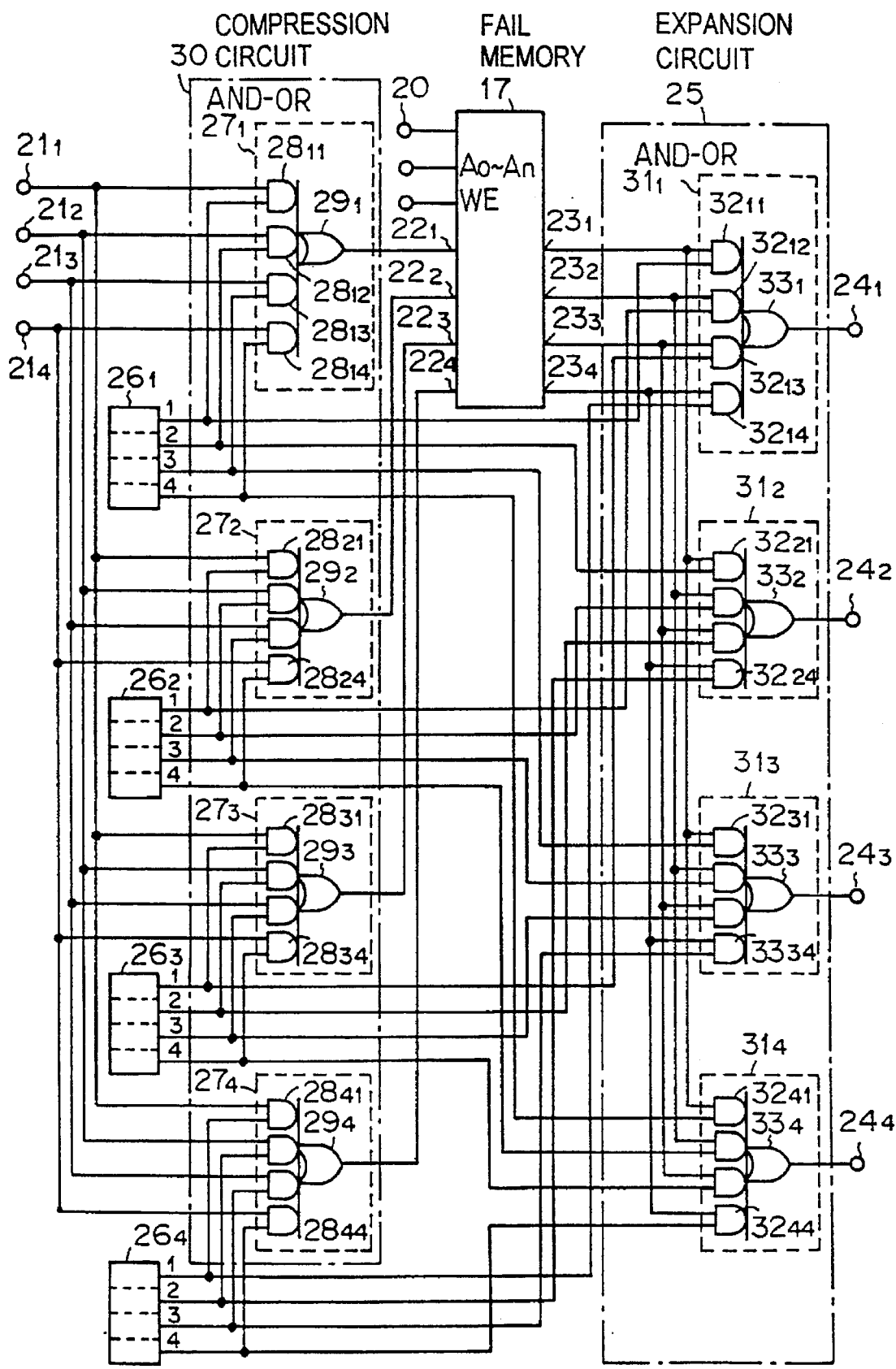
FIG. 1 is a logical circuit diagram showing an embodiment of a failure memory device according to the present invention.

Now an embodiment of the present invention will be described in detail with reference to FIGS. 1 and 2. Further, for the purpose of clarity, the portions in these figures corresponding to those in FIG. 3 have the same reference characters affixed and the explanation thereof will be omitted unless it is required.

FIG. 1 shows an embodiment of a failure memory device according to the present invention. This embodiment shows a case in which the present invention is applied to a failure memory device for use in testing a multi-bit memory of four bits, i.e., a memory in or of which a four bit data can be written or read out at a time. Therefore, in this case, a failure data of four bits which is the result of the logical comparison to the memory under test is stored in a failure memory 17 of the failure memory device and a mask pattern (mask data) is produced from this failure memory 17. However, needless to say, the present invention can also be applied to a failure memory device for use in testing any multi-bit memory other than four bit multi-memories.

The failure memory device shown has four input terminals $21_1$–$21_4$. A compression circuit 30 is provided between these input terminals and four input pins $22_1$–$22_4$ of the failure memory 17. Further, an expansion circuit 25 is provided between output pins $23_1$–$23_4$ of the failure memory 17 and output terminals $24_1$–$24_4$. In addition, four registers $26_1$–$26_4$ are provided corresponding to the four input terminals $21_1$–$21_4$, respectively. These registers $26_1$–$26_4$ are four bit registers and compression data each of four bits are stored in these registers, respectively. A multi-bit data from the input terminals $21_1$–$21_4$ can be compressed in accordance with any one of the compression data stored in the registers. Among the compression data stored in the registers, there is included a "compression 0" data, i.e., compression data indicating that no compression of data is effected. Usually, the setting of the compression data to each of the registers $26_1$–$26_4$ is performed by a controller (not shown) via a system bus prior to the start of a test.

The compression circuit 30 comprises four AND-OR circuits $27_1$–$27_4$. Each AND-OR circuit comprises four AND circuits corresponding to the four input terminals $21_1$–$21_4$ respectively and an OR circuit which performs a logical sum (OR) of the outputs of these four AND circuits. In the AND-OR circuit $27_1$, AND operations are performed in AND circuits $28_{11}$–$28_{14}$ between respective failure data from the input terminals $21_1$–$21_4$ and the first though the fourth bit outputs (one compression data) of the corresponding register $26_1$ respectively, and then the outputs of the AND circuits are supplied to an OR circuit $29_1$ where they are ORed. The ORed output of this OR circuit $29_1$ is supplied as the output of the AND-OR circuit $27_1$. Similarly, the AND-OR circuit $27_2$ comprises AND circuits $28_{21}$–$28_{24}$ for performing AND operations between respective failure data from the input terminals $21_1$–$21_4$ and the first through the fourth bit outputs (second compression data) of the corresponding register $26_2$ respectively and an OR circuit $29_2$ for performing an OR operation of the outputs of these AND circuits. The AND-OR circuit $27_3$ comprises AND circuits $28_{31}$–$28_{34}$ for performing AND operations between respective failure data from the input terminals $21_1$–$21_4$ and the first through the fourth bit outputs (third compression data) of the corresponding register $26_3$ respectively and an OR circuit $29_3$ for performing an OR operation of the outputs of these AND circuits. The AND-OR circuit $27_4$ comprises AND circuits $28_{41}$–$28_{44}$ for performing AND operations between respective failure data from the input terminals $21_1$–$21_4$ and the first through the fourth bit outputs (fourth compression data) of the corresponding register $26_4$ respectively and an OR circuit $29_4$ for performing an OR operation of the outputs of these AND circuits. The outputs of the AND-OR circuits $27_1$–$27_4$ are supplied to the input pins $22_1$–$22_4$ of the failure memory 17, respectively.

The expansion circuit 25 also comprises four AND-OR circuits $31_1$–$31_4$. Each AND-OR circuit comprises four AND circuits corresponding to four output pins $23_1$–$23_4$ of the failure memory 17 respectively and an OR circuit which performs an OR operation of the outputs of these AND circuits. In the AND-OR circuit $31_1$, AND operations are performed in AND circuits $32_{11}$–$32_{14}$ between the outputs from the output pins $23_1$–$23_4$ and the first bit outputs of the respective registers $26_1$–$26_4$, respectively, and then the outputs of the AND circuits are supplied to an OR circuit $33_1$ where they are ORed. The ORed output of this OR circuit $33_1$ is supplied as the output of the AND-OR circuit $31_1$. Similarly, the AND-OR circuit $31_2$ comprises AND circuits $32_{21}$–$32_{24}$ for performing AND operations between the outputs from the output pins $23_1$–$23_4$ and the second bit outputs of the respective registers $26_1$–$26_4$ respectively and an OR circuit $33_2$ for performing an OR operation of the outputs of these AND circuits. The AND-OR circuit $31_3$ comprises AND circuits $32_{31}$–$32_{34}$ for performing AND operations between the outputs from the output pins $23_1$–$23_4$ and the third bit outputs of the respective registers $26_1$–$26_4$ respectively and an OR circuit $33_3$ for performing an OR operation of the outputs of these AND circuits. The AND-OR circuit $31_4$ comprises AND circuits $32_{41}$–$32_{44}$ for performing AND operations between the outputs from the output pins $23_1$–$23_4$ and the fourth bit outputs of the respective registers $26_1$–$26_4$ respectively and an OR circuit $33_4$ for performing an OR operation of the outputs of these AND circuits. The outputs of the OR circuits $33_1$–$33_4$ are supplied to the output terminals $24_1$–$24_4$, respectively.

Since the failure memory device is arranged as mentioned above, any multi-bits of a failure data from the input terminals $21_1$–$21_4$ can be compressed in accordance with one of the compression data set in the registers $26_1$–$26_4$ and supplied to the failure memory 17. For example, in the case where four bits of a failure data from the input terminals $21_1$–$21_4$ are compressed into one bit and this one bit is supplied to the failure memory 17, a compression data of four bits each having 1 is stored in the register $26_1$ and a compression data of four bits each having 0 is stored in each of the registers $26_2$–$26_4$. By this setting, only the AND-OR circuit $27_1$ is enabled and the remaining AND-OR circuits $27_2$–$27_4$ are disabled. Therefore, all 0s are always outputted from each of the remaining AND-OR circuits $27_2$–$27_4$ and are supplied to the respective input pins $22_2$–$22_4$ of the failure memory 17. Consequently, respective bits of any failure data from the input terminals $21_1$–$21_4$ pass through the respective AND circuits $28_{11}$–$28_{14}$ of the AND-OR circuit $27_1$ as they are, and are ORed in the OR circuit $29_1$, namely, compressed to one bit data, and then the compressed one bit data is supplied to the input pin $22_1$ of the failure memory 17.

In this embodiment, a variable bit width failure memory is also used as the fail memory 17 as in the prior art, which is used in case that failure data are stored in the form of compression data. A data indicating the number of bits of one data from the memory under test, in this case a data indicating that the bit width is "1", is inputted to an input terminal 20 of the failure memory 17, and thus the failure memory 17 stores a failure data of one bit with a depth of four times at each address. That is, in this failure memory 17, since the bit width, namely, the number of the input pins $22_1$–$22_4$ thereof is four, in case a data indicating the bit width of a data applied to the input terminal 20 is four, then the memory stores the data with a depth of 1 in each address (this depth is one for storing one bit data when no compression of data is performed). In case a data indicating the bit width of a data applied to the input terminal 20 is two, then the memory stores the data with a depth of twice the depth of 1 in each address. In case a data indicating the bit width of a data applied to the input terminal 20 is one, then the memory stores the data with a depth of four times the depth of 1 in each address. In this example, since the data indicating one bit width is inputted to the input terminal 20, the four bits from the input terminals $21_1$–$21_4$ are compressed into one bit and this compressed data of one bit is stored in the failure memory 17 with four times the depth of 1.

The data read out from the failure memory 17 is expanded by the expansion circuit 25 in reverse with the relationship corresponding to the compression in the compression circuit 30, and then the expanded respective data are supplied to the output terminals $24_1$–$24_4$. In this example, since only the all bits of the register $26_1$ is 1, only the data outputted from the output pin $23_1$ among the data read out from the failure memory 17 is valid and the respective data outputted from the remaining output pins $23_2$–$23_4$ are uncertain. Therefore, AND operations are performed only between the expanded data from the output pin $23_1$ and the first through the fourth bit outputs of the register $26_1$ in the corresponding respective AND circuits $32_{11}, 32_{21}, 32_{31}$, and $32_{41}$ in the AND-OR circuits $31_1$–$31_4$ of the expansion circuit 25, and the results are supplied to the output terminals $24_1$–$24_4$ through the respective OR circuits $33_1$–$33_4$, respectively. That is, the one bit data read out of the output pin $23_1$ is expanded into a four bit data, and this four bit data is distributed bit by bit to the output terminals $24_1$–$24_4$. The remaining AND circuits in the AND-OR circuits of the expansion circuit 25 are disabled since the data being applied from the registers $26_2$–$26_4$ to those remaining AND circuits are zero. Therefore, those AND circuits are not influenced by the outputs from the output pins $23_2$–$23_4$ of the failure memory 17. Consequently, the data read out from the output pin $23_1$ is expanded and distributed to the output terminals $24_1$–$24_4$ which output the expanded data to the mask circuit as mask data.

Figure 2:
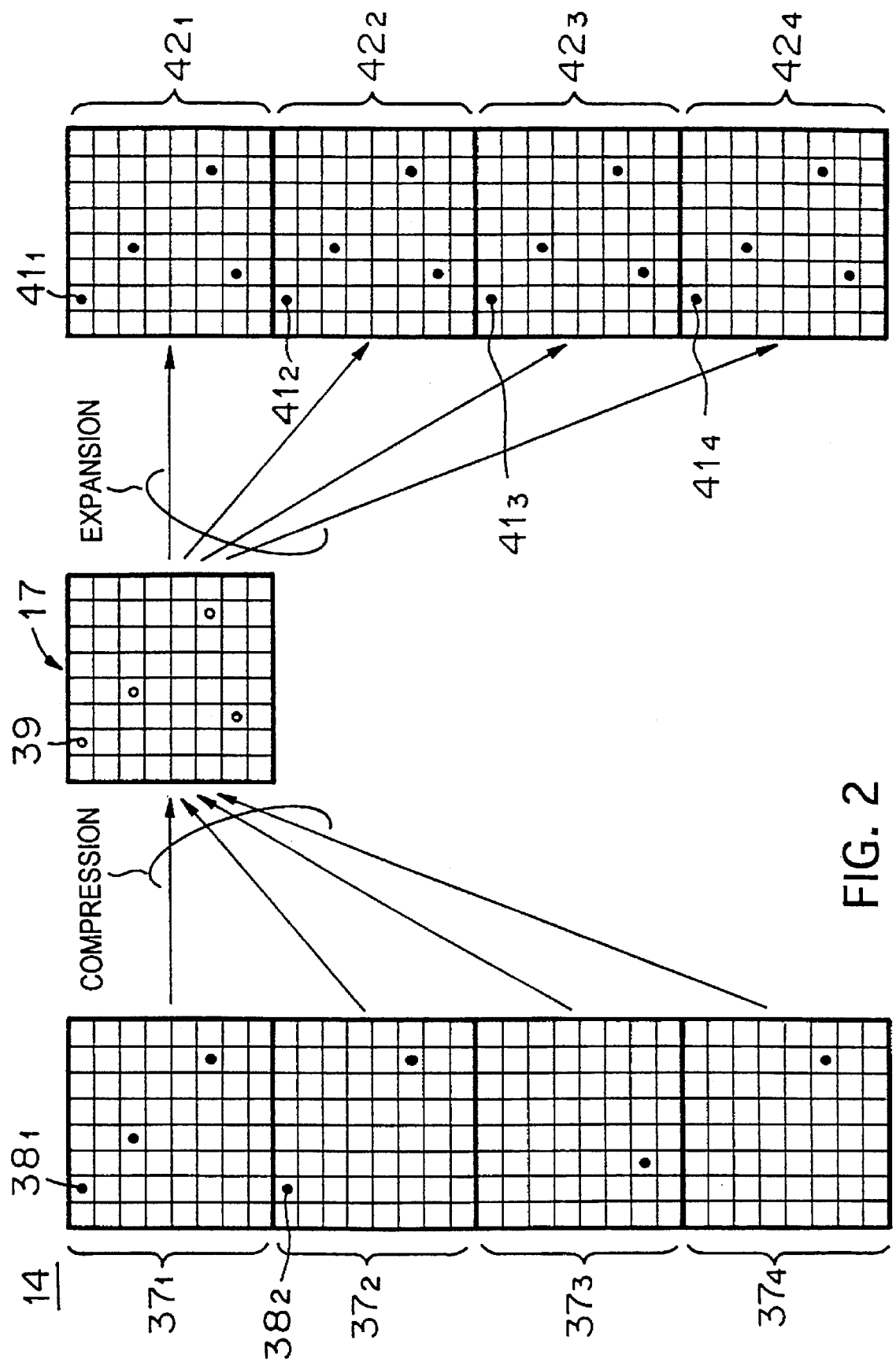
FIG. 2 is an illustration showing, in the embodiment of FIG. 1, the relation of correspondence between a failure state of a memory under test, a storage state of a failure memory and addresses of a mask pattern read out from the failure memory in case of compressing four bits into one bit.
Figure 3:
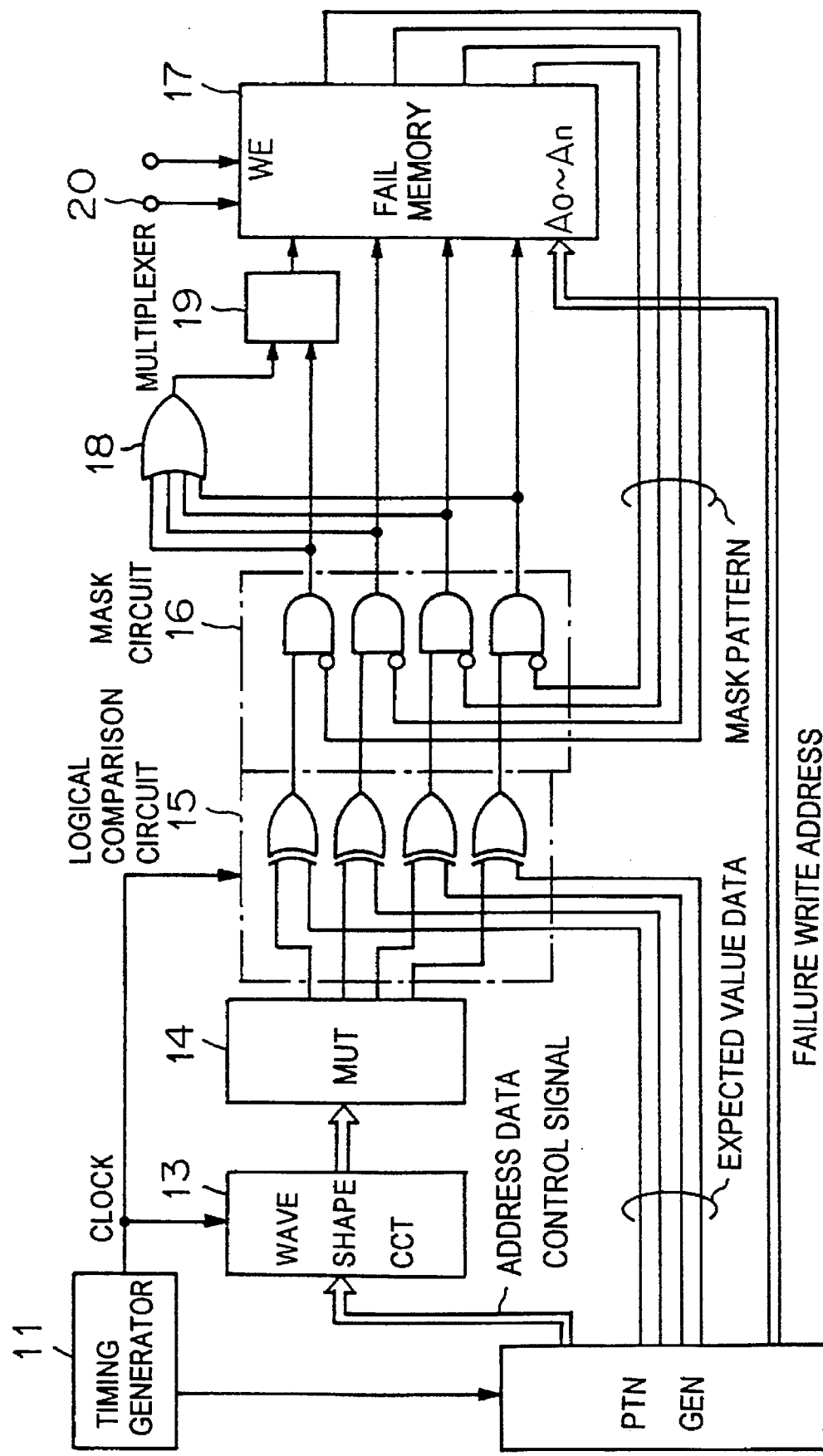
FIG. 3 is a block diagram showing a prior art semiconductor memory testing apparatus using a conventional failure memory device.
Figure 4:
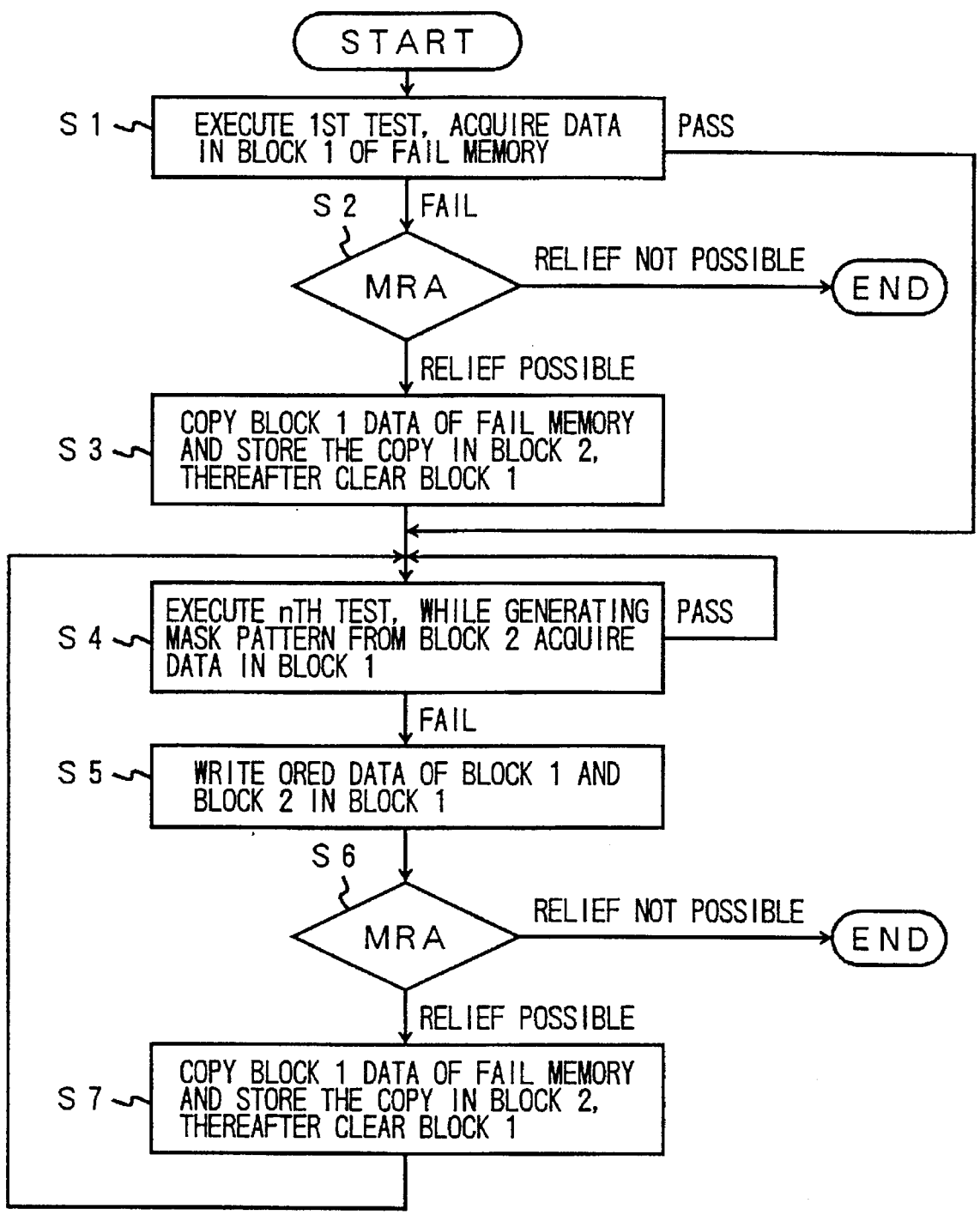
FIG. 4 is a flow chart for explaining a procedure of failure data storing process and mask data generating process in the prior art of FIG. 3.

A specific example is shown in FIG. 2. It is assumed that there are four areas $37_1$–$37_4$ in the memory under test 14 as shown in FIG. 2, and the cells each having the same address in the respective areas are read out at the same time, and the logical comparison results of those readout four data are supplied to the input terminals $21_1$–$21_4$ respectively, and the data of four bits from the input terminals $21_1$–$21_4$ are compressed into one bit and the compressed data of one bit is stored in the corresponding address in the failure memory 17 as one bit data. In FIG. 2, a black dot or small circle indicates a bit (cell) where a failure has been detected. For example, bits (cells) $38_1$ and $38_2$ are located in the same addresses of the areas $37_1$ and $37_2$ respectively and both bits (cells) are in a state of failure. Those two bits are compressed into one bit and this one bit is stored in the corresponding cell 39 of the fail memory 17. In FIG. 2, a white small circle in the failure memory 17 indicates a failure data compressed in bit. When the failure memory 17 in which respective failure data are compressed in bit and stored as mentioned above is read, each one bit data read out therefrom is expanded and distributed to four bits, and hence the one bit data read out from the failure memory 17 is expanded as if a failure has existed in each of the cells having the same addresses in the four areas $37_1$–$37_4$ of the memory under test 14. For example, in this example, though there exist failures only the bits $38_1$ and $38_2$ having the same addresses in the areas $37_1$ and $37_2$, the readout failure data is expanded as mask data indicating that not only the same address bits $41_1$ and $41_2$ in the areas $42_1$ and $42_2$ are in a state of failure but also the same address bits $41_3$ and $41_4$ in the areas $42_3$ and $42_4$ are in a state of failure. That is, if any one of the same addresses in the areas $37_1$–$37_4$ is in a state of failure, the failure bit is expanded to mask data indicating that there exist failures in all of the same addresses in the areas $42_1$–$42_4$. Accordingly, there are generated mask data for masking all the logical comparison results on the same addresses in the areas $37_1$–$37_4$ at the same time. The black small circles in the areas $42_1$–$42_4$ indicate the expanded failure data.

Incidentally, as easily understood from FIG. 2, the actually generated failure data are different from the mask data which are generated by compressing and expanding the failure data. However, as mentioned above, in a memory where a redundant relief line is provided every a plurality of bits, there is no problem because the failure data are compressed and expanded for each relief line group. That is, for the failure data belonging to the same relief line group, there is no problem at all even if the same mask data are applied.

When the failure data are not compressed, it will be understood very easily that the compression data are stored in the respective registers as follows. That is, in the register $26_1$, the first bit is set to 1 and the remaining bits are all set to 0, in the register $26_2$, the second bit is set to 1 and the remaining all bits are set to 0, in the register $26_3$, the third bit is set to 1 and the remaining all bits are set to 0, and in the register $26_4$, the fourth bit is set to 1 and the remaining all bits are set to 0. Further, if the memory device is arranged as shown in FIG. 1, it will be easily understood that a plurality of any data of the input terminals $21_1$–$21_4$ can be compressed and supplied to any one or more input pins and the read out data from the output pins can be expanded in reverse to the compression. In addition, in the aforementioned embodiment, the present invention is applied to the failure memory device which uses the four bit memory. However, in general, it is needless to say that the present invention can be applied to a multi-bit memory of n bits (n is an integer equal to or greater than 2). For example, when the number of bits of the failure data is n, the failure memory device can similarly be constructed by providing n registers each having n bits, n AND-OR circuits for bit compression each comprising n AND circuits and an OR circuit, and n AND-OR circuits for bit expansion each comprising n AND circuits and an OR circuit.

As mentioned above, according to the present invention, a compression data is set in each of a plurality of registers, failure data are compressed in bit as desired or not compressed in bit using these compression data and each data read out from the failure memory is expanded in reverse to the compression. Therefore, when the failure data are bit compressed and stored in the failure memory, the mask data for inhibiting the writing of the failure data more than once can be read out from the failure memory. Particularly, in the memory where a redundant relief line is provided every a plurality of bits, the failure data are compressed for each relief line group and the failure data can be expanded corresponding to the compressed failure data. Therefore, the mask data which can surely inhibit the writing of the failure data more than once can be generated.

What is claimed is:

1. A failure memory device wherein a failure data obtained from the result of logical comparison between a data read out from a memory under test and an expected value data is written in a failure memory which is a variable bit width memory, the content of said failure memory is read out to generate a mask pattern, and the writing of the failure data more than once in said failure memory is inhibited by said mask pattern, said failure memory device comprising:

n (n is an integer equal to or greater than 2) input terminals each supplied with a failure data;

registers each having a compression data inputted;

a compression circuit for compressing a plurality of data among failure data inputted to said n input terminals in accordance with the compression data inputted to said registers to supply the compressed data to said failure memory; and an expansion circuit for expanding the data read out of said failure memory to n output terminals in accordance with the compression data in said registers to output the expanded data as said mask pattern.

2. The failure memory device according to claim 1, wherein said registers consist of n registers of the first through the n-th each having n bits, said compression circuit consists of n AND-OR circuits of the first through the n-th each comprising n AND circuits and an OR circuit for performing an operation of logical sum of the outputs of said n AND circuits, the i-th ($i=1, 2, \ldots, n$) AND-OR circuit performing operations of logical products between the first through the n-th bit outputs of the i-th register and the inputs of the first through the nth input terminals respectively and performing an operation of logical sum of the outputs of said logical products, and then supplying the ORed output to the i-th input pin of said failure memory, and said expansion circuit consists of n AND-OR circuits of the first through the n-th each comprising n AND circuits and an OR circuit for performing an operation of logical sum of the outputs of said AND circuits, the j-th ($j=1, 2, \ldots, n$) AND-OR circuit performing operations of logical products between the outputs of the first through the n-th output pins of said failure memory and the j-th bit outputs of the first through the n-th registers respectively and performing an operation of logical sum of said logical products, and then supplying the ORed output to the j-th output terminal of said n output terminals.

* * * * *